United States Patent
Shimazaki et al.

(10) Patent No.: US 7,221,215 B2
(45) Date of Patent: May 22, 2007

(54) DEMODULATOR FOR DEMODULATING PULSE POSITION MODULATED SIGNAL

(75) Inventors: Yoshihito Shimazaki, Kanagawa (JP); Hiroji Akahori, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 189 days.

(21) Appl. No.: 11/068,921

(22) Filed: Mar. 2, 2005

(65) Prior Publication Data
US 2005/0206446 A1    Sep. 22, 2005

(30) Foreign Application Priority Data
Mar. 5, 2004    (JP) ............... 2004-061515

(51) Int. Cl.
*H03K 9/04* (2006.01)
(52) U.S. Cl. .................. 329/313; 375/239
(58) Field of Classification Search ........... 329/313; 375/239
See application file for complete search history.

(56) References Cited

U.S. PATENT DOCUMENTS 5,691,665 A * 11/1997 Ohtani ................ 329/313
5,977,822 A * 11/1999 Rybicki et al. ........ 329/313
6,292,051 B1 * 9/2001 Su et al. ............... 329/313
2003/0174779 A1    9/2003 Sugaya et al.

FOREIGN PATENT DOCUMENTS

JP        5-284129        10/1993

* cited by examiner

Primary Examiner—Joseph Chang
(74) Attorney, Agent, or Firm—Nixon Peabody LLP; Donald R. Studebaker

(57) ABSTRACT

A PPM signal demodulator for demodulating a PPM signal transmitted in a UWB radio communication system includes a rectifier for rectifying a received PPM signal to obtain an absolute value signal, integrator and comparators for integrating the absolute value signal for every first, second and third integral times and comparing the integrated values for the integral times, absolute value circuits for converting respective outputs of the integrator and comparators to corresponding absolute values, moving average circuits for moving-averaging respective outputs of the absolute value circuits, a determining circuit for generating demodulation data on the basis of the integrated and compared result by the integrator and comparator, and a main control for generating, on the basis of the outputs of the moving average circuits, integral interval control signals that control the first, second and third integral times to supply them to the respective integrator and comparators.

6 Claims, 6 Drawing Sheets

DEMODULATOR FOR DEMODULATING PULSE POSITION MODULATED SIGNAL

BACKGROUND OF THE INVENTION

1. Field of the Invention

The present invention relates to a demodulator for receiving and demodulating a pulse position modulated (PPM) signal transmitted in a radio communication system using an ultra wide band (UWB).

2. Description of the Background Art

In recent years, proposals have been made for radio communication systems using an ultra wide band. For example, as disclosed in U.S. patent application publication No. US2003/0174779 A1, a UWB communication system spreads a data signal spectrum over an ultra wide band in the order of, for example, 2-6 GHz to accomplish pulse transmission.

In a conventional radio transmission system, a transmitter multiplies a carrier frequency by a modulation component to generate an output signal to be transmitted, while a receiver multiplies the received input signal by the same carrier frequency as that of the transmitter side to thereby extract the modulation component. The receiver was configured to include a mixer for multiplying a received signal by a frequency equal to the carrier frequency to convert it to a baseband signal, a processor for sampling the signal with high resolution to determine the signal, and a rake receiver for absorbing the delay time involved in waves arriving over multiple paths to thereby accomplish demodulation.

Also, there was a pulse transmission device for receiving pulse signals rather than such carrier signals, disclosed for example in Japanese patent laid-open publication No. 284129/1993. For example, in a pulse transmission system, such as a pulse position modulation (PPM) system, a waveform to be transmitted is pulsated and carries modulation information at a time position at which the waveform takes its significant level, thereby making it possible to maintain the transmission power as well as to make effective use of the transmission bandwidth.

However, the conventional radio transmission system, when applied to a UWB radio communication system, would cause the conventional configuration including a mixer for modulation and demodulation, a sampling circuit for sampling signals with high resolution and a rake receiver for determining demodulation to raise a problem that the scale of the circuits increases as the band is broadened.

Thus, in Japanese patent application No. 2004-179745 filed in the name of the same assignee as the present patent application, there is proposed a pulse modulator and a PPM demodulation determining circuit in ultra wide band radio communications. The PPM demodulation determining circuit is so configured that an output pulse transmitted is regarded as an electric power to then detect the absolute value of the received signal, integrate the latter for every integral time, and compare the resultant integrated values for the respective integral times with each other to determine at which position the pulse signal exists, thereby determining demodulation. That eliminates the need for the configuration of a mixer, a sampling circuit, a rake receiver and the like described above.

Now, in the specification of the above-mentioned patent application, there is disclosed the configuration for integration for every integral time. However, in order to attain the more optimal reception property, it has become necessary to seek a configuration that determines the length of integral time. Specifically, a PPM signal demodulator is called for, which is capable of optimizing the processing to implement signal control so as to make the reception property favorable without requiring the conventional configuration of a mixer, a sampling circuit and a rake receiver.

SUMMARY OF THE INVENTION

It is an object of the present invention to provide a PPM signal demodulator capable of advantageously demodulating a received signal without increasing the circuit configuration, in order to accomplish ultra wide band radio communication.

In accordance with the present invention, a pulse position modulated (PPM) signal demodulator for receiving and demodulating a PPM signal transmitted in an ultra wide bandwidth radio communication system using an ultra wide bandwidth includes a rectifier for receiving and rectifying the PPM signal to obtain an absolute value signal, first, second and third integrating comparators for integrating the absolute value signals for first, second and third integral times, respectively, and comparing integrated values for the respective integral times with each other, a determining circuit connected to the second integrating comparator for determining the PPM signal on the basis of an integrated and compared result by the second integrating comparator to output demodulated data, and a control circuit for generating first, second and third integral interval control signals for controlling the first, second and third integral times, respectively, on the basis of the respective integrated and compared results by the first, second and third integrating comparators, whereby the first, second and third integrating comparators integrate the absolute value signals for the respective lengths of integral times.

Further, in accordance with the present invention, a pulse position modulation signal demodulator for receiving and demodulating a PPM signal transmitted in an ultra wide bandwidth radio communication system using an ultra wide bandwidth includes a rectifier for receiving and rectifying the PPM signal to obtain an absolute value signal, a first integrating comparator for integrating the absolute value signal for every first integral time and comparing the integrated values for the respective integral times with each other, a second integrating comparator for integrating the absolute value signal for every second integral time and every third integral time on the time-sharing basis and comparing the respective integrated values for the respective integral times with each other, a determining circuit connected to the first integrating comparator for determining the PPM signal on the basis of the integrated and compared result by the first integrating comparator to output demodulated data, a control circuit for generating first, second and third integral interval control signals for controlling the first, second and third integral times on the basis of the respective integrated and compared results by the first and second integrating comparators, and a switching circuit for supplying either of the second and third integral interval control signals to the second integrating comparator, the first integrating comparator integrating the absolute value signal for the length of the first integral time associated with the first integral interval control signal, the second integrating comparator integrating the absolute value signal for the length of the second or third integral time associated with the second or third integral interval control signal fed from the switching circuit.

Still further, in accordance with the present invention, a pulse position modulated (PPM) signal demodulator for receiving and demodulating a PPM signal transmitted in an ultra wide bandwidth radio communication system using an ultra wide bandwidth includes a rectifier for receiving and rectifying the PPM signal to obtain an absolute value signal, a first integrating comparator for integrating the absolute value signal for every first integral time and comparing the integrated values for the respective integral times with each other, a second integrating comparator for integrating the absolute value signal for every second integral time and every second integral time on the time-sharing basis and integrating the respective integrated values for the respective integral times with each other, a determining circuit connected to the first integrating comparator for determining the PPM signal on the basis of the integrated and compared result by the first integrating comparator to output demodulated data, a control circuit for generating first, second and third integral interval control signals for controlling the first, second and third integral times on the basis of the respective integrated and compared results by the first and second integrating comparators, a switching circuit for supplying either of the second and third integral interval control signals to the second integrating comparator, the first integrating comparator integrating the absolute value signal for the length of the first integral time associated with the first integral interval control signal, the second integrating comparator integrating the absolute value signal for the length of the second or third integral time associated with the second or third integral interval control signal fed from the switching circuit, a second switching circuit for selecting either of the outputs of the first and second integrating comparators to output it, and a converter for converting the output of the second switching circuit to a digital value to supply it to the control circuit, the control circuit generating the first, second and third integral interval control signals, respectively, on the basis of the digital value.

In accordance with the present invention, there is provided a PPM signal demodulator, without requiring a conventional configuration consisted of a mixer, a sampling circuit and a rake receiving circuit, capable of preventing the circuit configuration from growing and automatically optimizing the receive control so as to allow a received signal to be well restored, and in particular capable of automatically selecting the length of integral time to determine demodulation of a received signal.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Figure 1:
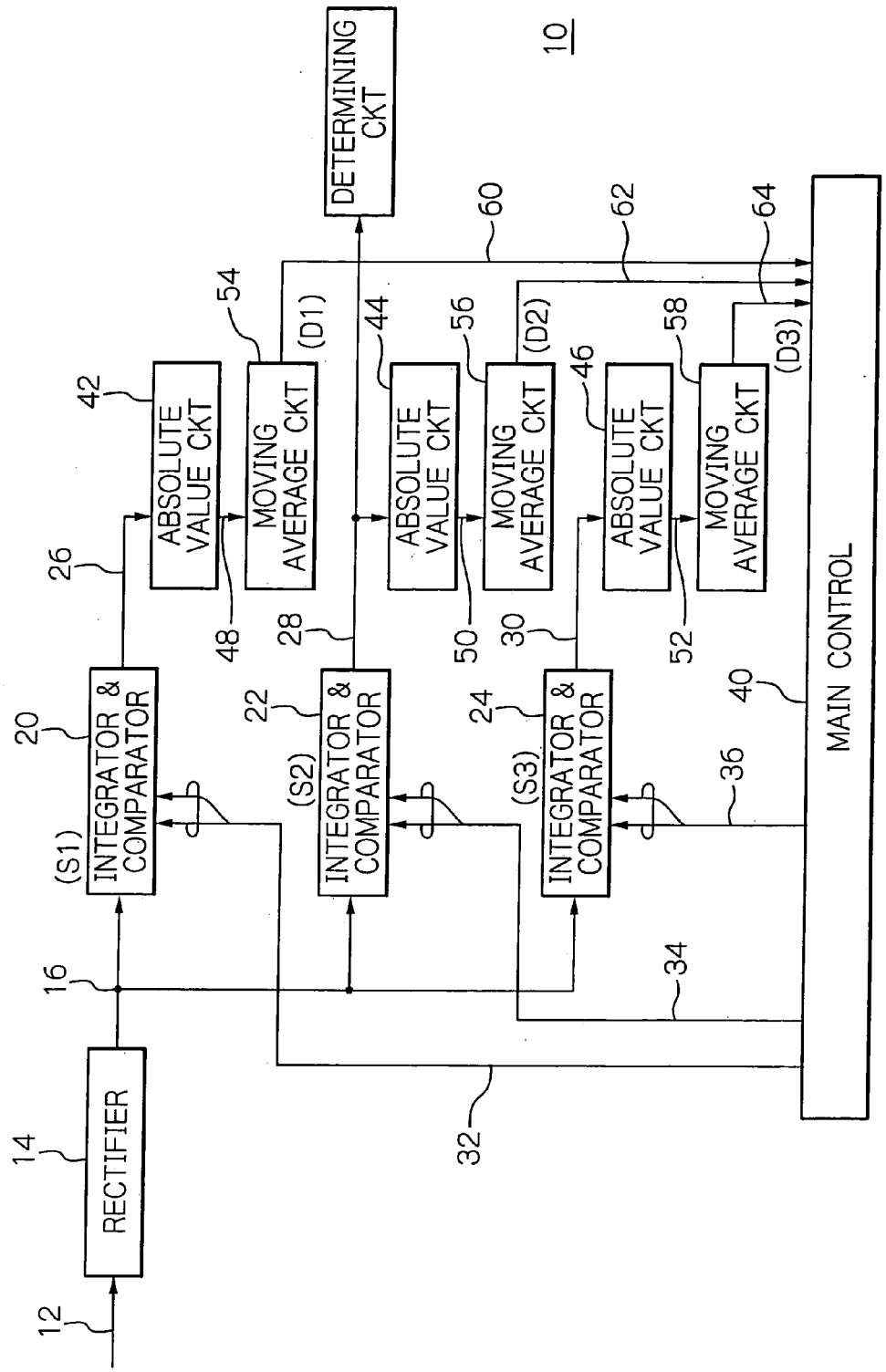
FIG. 1 is a schematic block diagram showing a preferred embodiment of a PPM demodulation determining circuit to which the present invention is applied.

In the following, with reference to the accompanying drawings, embodiments of the PPM signal demodulator in accordance with the present invention will be described in detail. FIG. 1 shows an embodiment of the PPM signal demodulation determining circuit to which the present invention is applied. The PPM signal demodulation determining circuit 10 in the embodiment is a demodulator which uses a transmission band of, for example, an ultra wide band (UWB) and employs a pulse position modulation (PPM) in which an output wave to be transmitted is pulsated in order to hold the transmission power and modulation information is loaded at a time position at which waves to be transmitted are outputted, thereby receiving the PPM signal transmitted in the ultra wide band to determine demodulation thereof.

The PPM demodulation determining circuit 10 is adapted in principle to regard a pulse as electric power, which is a transmitted output in the PPM system, and determine whether or not the power is in an appropriate or intended position to thereby determine demodulation. Wherefore, the circuit 10 is adapted to detect the absolute value of, or alternatively full-wave rectify or half-wave rectify, a received signal and integrate the absolute value. The circuit 10 is mainly characterized in that, in order to obtain the optimal receiver property, the circuit 10 is adapted to determine a length of integrating time optimizing the property so as to control the length of integrating time. In the following configuration of the pertinent portions will be described in detail.

As shown in the figure, the PPM demodulation determining circuit 10 is a receiver demodulator which is adapted for receiving a signal transmitted, after pulse position modulated, and demodulating the received signal inputted on an input 12 to finally output it in the form of demodulated data. Parts not directly related to understanding the present invention will be omitted from the drawings and description thereof.

The PPM demodulation determining circuit 10 in the embodiment comprises a rectifier 14 having its input 12 receiving a received signal from an air interface, not shown. The rectifier 14 is a wave detecting circuit which rectifies the received signal 12 to output the rectified signal on its output 16. Signals will be designated with reference numerals of connections on which they appear. The rectifier 14 may be configured to obtain, for example, the absolute value, or magnitude, of the received signal 12. Specifically, the rectifier 14 may be adapted to full wave rectify the input signal 12, or alternatively may be configured to half-wave rectify the received signal 12, to then output the resultant signal. The output 16 of the rectifier 14 is connected to integrator and comparators 20, 22 and 24.

The integrator and comparators, or integrating comparators, 20, 22 and 24 are adapted to integrate signals inputted on the respective inputs 16 thereof for every predetermined period and compare the resultant integrated values, associated with a plurality of PPM modulated phases, with each other to then develop a comparison result on outputs 26, 28 and 30, respectively. The integrator and comparators 20, 22 and 24 may have configuration similar to each other. Each of the integrator and comparators 20, 22 and 24 is structured to have the integral time controllable by an integral interval control signal inputted on the inputs 32, 34 and 36. Each of the integrator and comparators 20, 22 and 24 integrates the input signal 16 for an integral time and a timing associated with the supplied integral interval control signal 32, 34 and 36, respectively.

Figure 2:
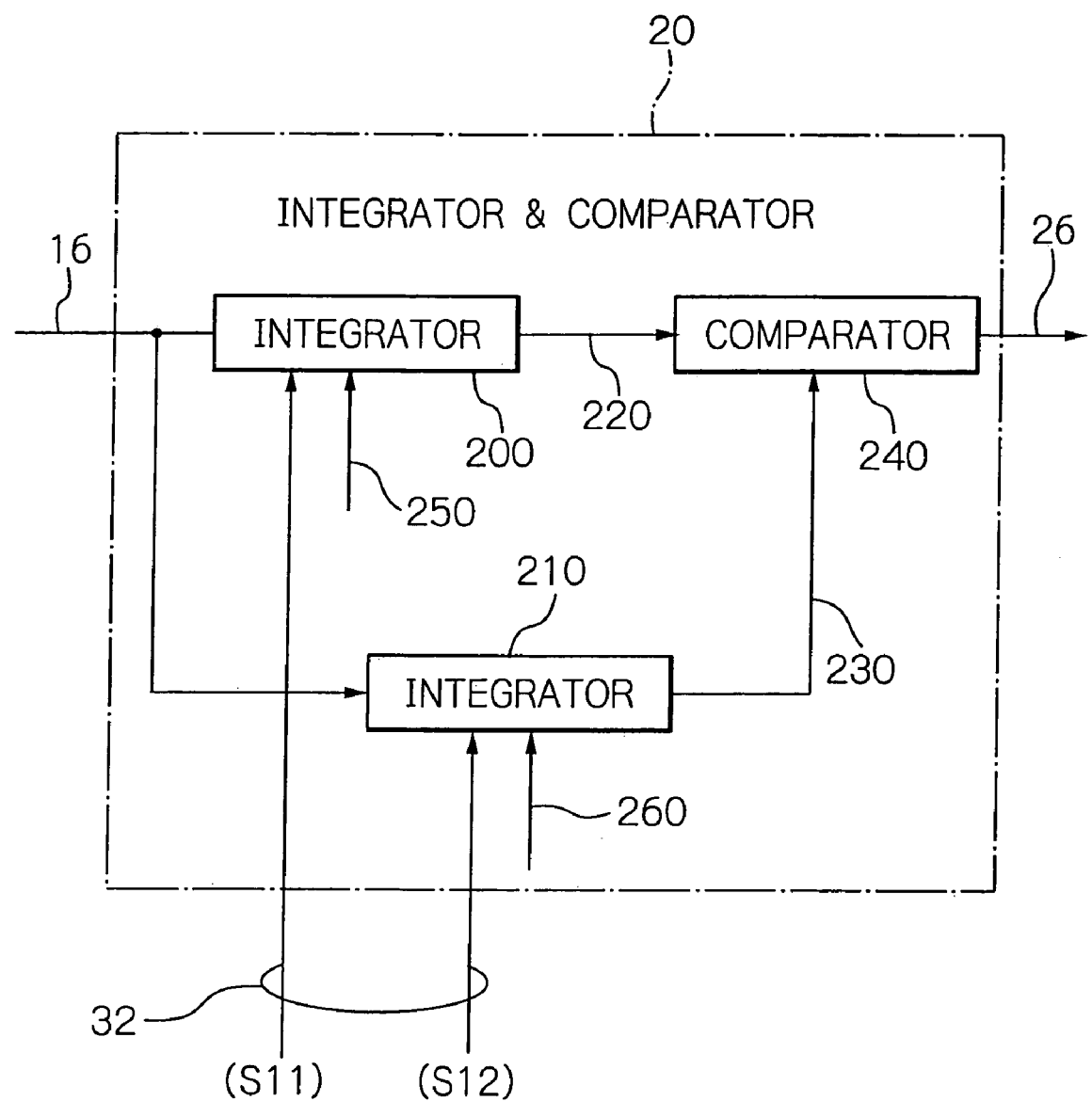
FIG. 2 is a schematic block diagram showing an example of the internal configuration of an integrator and comparator included in the embodiment shown in FIG. 1.

An example of the integrator and comparators 20, 22 and 24 is shown in FIG. 2. In the figure, there is exemplified the integrator and comparator 20. The remaining integrator and comparators 22 and 24 may have the same configuration. The integrator and comparator 20 includes a set of integrators 200 and 210 connected to the input 16. The integrators 200 and 210 are operating circuits for integrating the input signals at timings and for periods of time associated with the integral interval control signals 32 supplied on the respective control inputs 32 thereof. The integrators are adapted to output the resultant integrated values obtained for the respective integral times on the respective outputs 220 and 230 thereof. The outputs 220 and 230 are interconnected to a comparator 240, which is adapted to compare the amplitudes of input signals on the inputs 220 and 230. Specifically, the comparator 240 compares the input signals 220 and 230 in level with each other in the period of time, or interval, from the completion of the integration for the integral time controlled by the integral interval control signal 32 to the start of discharging the integrated value at a predetermined discharge timing, thereby determining in which integral interval a pulse position modulated signal exits to then output the determination result on its output 26.

Although the exemplified circuit shown in the figure includes a couple of integrators 200 and 210, the integrator and comparator 20 may be configured to have an additional integrator and render the comparator 240 comparing the outputs from the plurality of integrators with each other. The predetermined discharging timing is controlled by discharge control signals 250 and 260 provided to the integrators 200 and 210, respectively. The discharge control signals 250 and 260 may be fed from, for example a main control 40.

Figure 3:
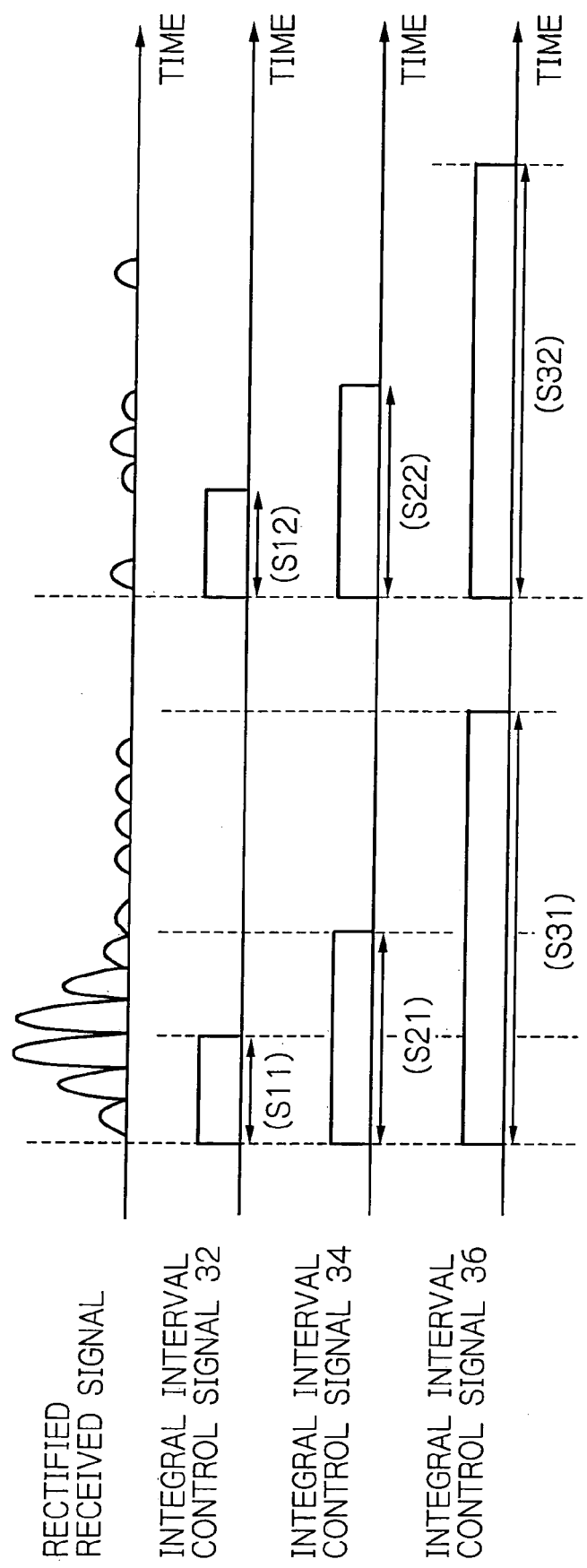
FIG. 3 is a timing chart showing an example of a rectified received signal output and integral interval control signals.

Referring again to FIG. 1, inputted to the integrator and comparators 20, 22 and 24 are the integration interval control signals 32, 34 and 36 from the main control 40, respectively. The integrator and comparators 20, 22 and 24 integrate input signals at respective timings associated with the respective inputted integral interval control signals 32, 34 and 36. Now, referring to FIG. 3 showing an exemplified status of the integral interval control signals 32, 34 and 36 and the rectified received signal output, the integral interval control signal 32 in the-embodiment is a control signal that controls two intervals; a first interval S11 and a second interval S12. The preceding control signal for controlling the first interval S11 is fed to the integrator 200, FIG. 2, and the following control signal for controlling the second interval S12 is to the integrator 210, FIG. 2.

The integral interval control signal 34 is a similar control signal that controls two intervals of a first interval S21 and a second interval S22. The first interval S21 and the second interval S22 of the integral interval control signal 34 are determined to be twice as long as the first interval S11 and the second interval S12 of the integral interval control signal 32, respectively. Further, the integral interval control signal 36 is a control signal that controls two intervals; a first interval S31 and a second interval S32. The first interval S31 and the second interval S32 of the integral interval control signal 36 are determined to be twice as long as the first interval S21 and the second interval S22 of the integral interval control signals 34, respectively. In this way, the length of integral time defined by each integral interval signal is arranged to have a relationship corresponding to the n-th power of two.

Referring back to FIG. 1, the integrator and comparators 20, 22 and 24 integrate the rectified outputs provided in common from the rectifier 16 for the intervals controlled by the respective integral interval control signals 32, 34 and 36, and compare the rectified outputs with each other in the first or second interval to output on the respective outputs 26, 28 and 30 the rectified outputs S1, S2 and S3 each of which has a larger amplitude.

The outputs 26, 28 and 30 of the integrator and comparators 20, 22 and 24 are, respectively, connected to absolute value circuits 42, 44 and 46. The absolute value circuits 42, 44 and 46 are adapted for obtaining the absolute values of the output signals from the respective integrator and comparators 20, 22 and 24. By means of the processing in the absolute value circuit 42, 44 and 46, it is possible to stably obtain absolute values, regardless of the conditions of the phase of the PPM modulated components. The absolute value circuits 42, 44 and 46 have the respective outputs thereof interconnected to moving average circuits 54, 56 and 58, respectively.

The moving average circuits 54, 56 and 58 are processing circuits for respectively moving-averaging the output values (S1, S2 and S3) 48, 50 and 52 from the absolute value circuits 42, 44 and 46 to develop resultant moving-averaged values D1, D2 and D3 on the respective outputs 60, 62 and 64 thereof. The moving average circuits 54, 56 and 58 are thus structured to moving-average the absolute values calculated through the integration for a plurality of lengths of integral times, thereby making it possible to avoid the determined length of integral time from being unstable due to the influence of noise and the like. The respective outputs 60, 62 and 64 of the moving average circuits 54, 56 and 58 are connected to the main control 40.

The main control 40 comprises a processor system which is adapted to be responsive to the moving-averaged values (D1, D2 and D3) 60, 62 and 64 fed from the moving average circuits 54, 56 and 58 for determining the length of integral times S1, S2 and S3 which will be provided to the integrator and comparators. The main control 40 reflects the determined length of integration time on the integral interval control signal to produce the outputs 32, 34 and 36 to the integrator and comparators 20, 22 and 24.

The length of integral times S1, S2 and S3 is set to a value with which satisfies the following expression (1):

$$S1 = (S2/2) = (S3/4) \tag{1}$$

Integration is made with the lengths of integral times S1, S2 and S3 to output the results of comparison made between the respective integrated values corresponding to a plurality of PPM-modulated phases. The results therefrom are inputted in the absolute value circuits 42, 44 and 46 from the integrator and comparators 20, 22 and 24, respectively, where they are converted to absolute values, which will further be moving-averaged by the moving average circuits 54, 56 and 58 to obtain moving-averaged values (D1, D2 and D3) 60, 62 and 64. The main control 40 examines those values on the basis of the following expressions (2) and (3), where, $\alpha 1$ and $\alpha 2$ are desired values for comparison and are given values smaller than "1".

$$D1 < \alpha 1 \times D2 \tag{2}$$

$$D2 > \alpha 2 \times D3 \tag{3}$$

The main control 40, when both expressions (2) and (3) are satisfied, uses the value for the length of integral times S1, S2 and S3 as they are. On the contrary, when the expressions (2) and (3) are not satisfied but the following expression (4) is satisfied, the main control 40 substitutes a value of S2 for that of S1:

$$D1 > \alpha 1 \times D2 \qquad (4)$$

In that case, the values S2 and S3 are changed to values which satisfy the expression (1) with the value S1 substituted as above.

Further, when even the expression (4) is not satisfied but the following expression (5) is satisfied, the value of S3 is substituted for by that of S2, and the values S1 and S2 are changed to values which satisfy the expression (1) with the value S3 substituted as above.

$$D2 < \alpha 2 \times D3 \qquad (5)$$

Moreover, when even the expression (5) is not satisfied, the value for the length of integral time S1, S2 and S3 is used as it is.

By means of the calculation and determination processing, the main control 40 reflects the lengths of the integral times S1, S2 and S3 to be fed to the integrator and comparators 20, 22 and 24 on the integral interval control signals 32, 34 and 36, respectively, to output them. As the value for integrating comparison to obtain the demodulation results, employed is a value integrated for the length of integral time S2. More specifically, the main control 40 supplies the integrator and comparator 22 with an integral interval control signal 34 for controlling the integration for the length of time finally determined as the value of S2 to control the integral time. Thus, while the length of integral time for the rectified and outputted PPM signal is automatically adapted, demodulation can be executed on the basis of the integration results.

In addition, when smoothing by the moving average circuits 54, 56 and 58 is predominant, it may be necessary to initialize values held in the respective moving average circuits 54, 56 and 58 right after the values for the lengths of integral times S1, S2 and S3 are altered. In that case, the moving average circuits 54, 56 and 58 are initialized along with alteration of the values for the lengths of integral times S1, S2 and S3.

Figure 4:
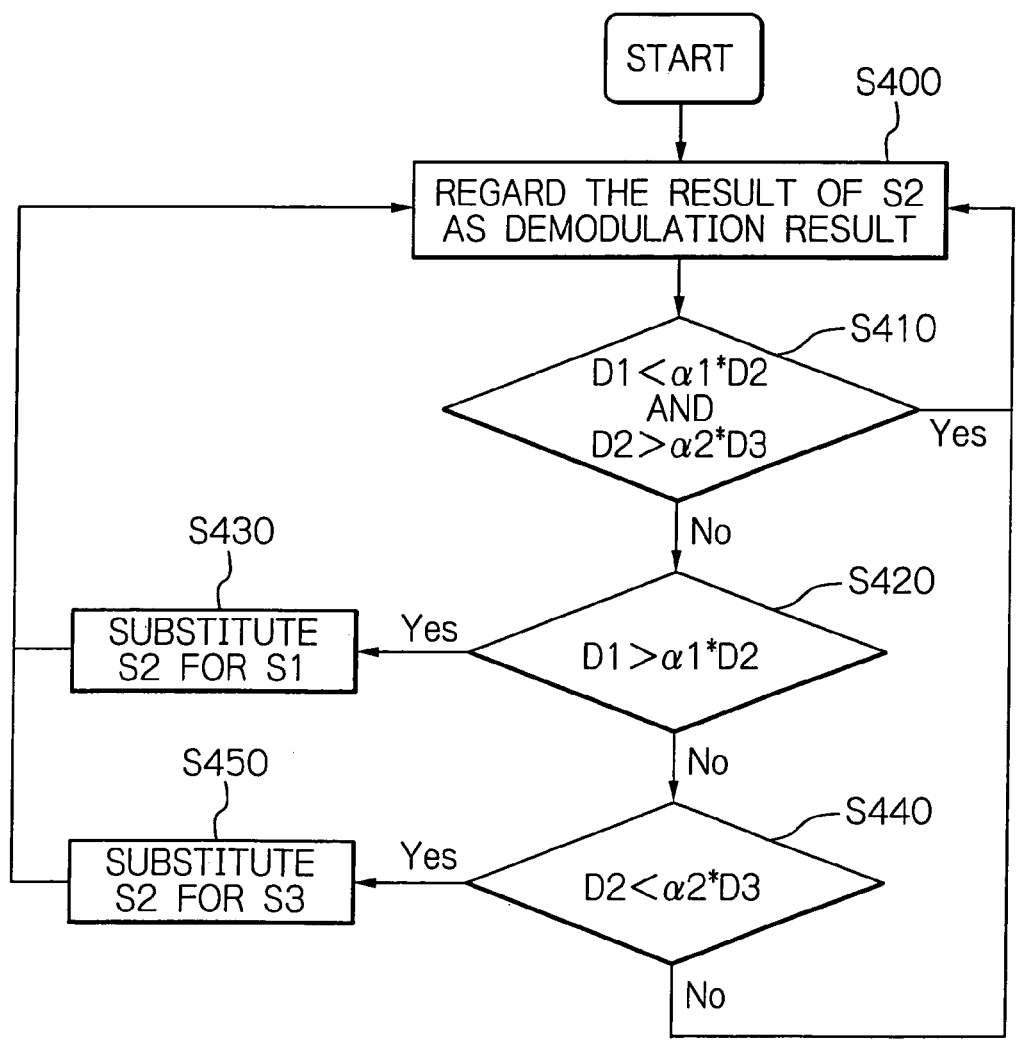
FIG. 4 is a flowchart useful for understanding determination made by a main control included in the embodiment.

With the configuration described above, the control of the integral time in the PPM demodulation determining circuit 10 will be described with reference to FIG. 4. To begin with, in the step S400, the output of the integrator and comparator 22 according to the length of integral time S2 is employed to determine demodulation. Then, proceeding to the step S410, operation is made by the expression (2) (D1<α1×D2) and the expression (3) (D2>α2×D3) to determine whether or not both of them hold good. When both expressions (2) and (3) hold good, the operation returns to the step S400. On the contrary, when they do not hold good, the operation proceeds to the step S420.

On proceeding to the step S420, determination is made on whether or not the expression (4) (D1>α1×D2) holds good. When the expression holds good, then the operation proceeds to the step S430. On the contrary, when it does not hold good, the operation proceeds to the step S440. In the step S430, the value S2 is substituted for the value S1, so that the value S1 becomes S2. After the substitution, the value S1 resultant from the substitution is used to obtain new values S2 and S3 according to the conditions defined by the expression (1). Thereafter, the operation returns to the step S400.

On proceeding to the step S440, determination is further made on whether or not the expression (5) (D2<α2×D3) holds good. When the expression (5) holds good, the operation proceeds to the step S450. On the contrary, when it does not hold good, it returns to the step S400. On proceeding to the step S450, the value S2 is substituted for S3, so that the value S3 becomes S2. After the substitution, the value S3 resultant from the substitution is used to obtain new values S1 and S2 according to the conditions defined by the expression (1). Thereafter, the operation returns to the step S400.

In this way, when the integral interval control signals S1, S2 and S3 are determined, the integrator and comparators 20, 22 and 24 integrate the absolute value signals 16 on the basis of the respectively supplied integral interval control signals 32, 34 and 36, respectively, to output the comparison results 26, 28 and 30 associated with the comparison results of the integrated values for every predetermined period.

As shown in FIG. 3, the respective integral values in the first and second intervals S21 and S22 of the integral interval control signal 34 are compared with each other by the integrator and comparator 22. Particularly, the output 28 of the integrator and comparator 22 is provided to the determining circuit 70, so that the determining circuit 70 determines and recognizes which integral time a pulse signal has existed in on the basis of the result of the comparison between the first and second intervals S21 and S22 to then output data adaptively demodulated to the pulse position on its output 72.

Well, an alternative embodiment of the PPM demodulation determining circuit will be described with reference to FIG. 5. As shown in the figure, a PPM demodulation determining circuit 500 includes the rectifier 14 for rectifying a received signal 12 to output it on its output 16, the integrator and comparators 20 and 22 for integrating and comparing the output 16 of the rectifier 14, the absolute value circuit 42 connected to the output 26 of the integrator and comparator, and the moving average circuit 54 connected to the output 48 of the absolute value circuit 24. Those components may be structured identically with those designated with the corresponding reference numerals shown in FIG. 1. The integrator and comparator 20 in the alternative embodiment executes integration and comparison in response to the integral interval control signal 32 supplied from the main control 50.

The output 16 of the rectifier 14 is connected also to the integrator and comparator 22. The integrator and comparator 22 in this embodiment integrates the input signal 16 for the length of integration time designated with an integral interval control signal 506 supplied through a switching circuit 506. The integrator and comparator 22 also compares integral values corresponding to a plurality of PPM-modulated phases to then output the comparison result on its output 514. The switching circuit 504 is adapted for outputting either of the integral interval control signals 34 and 36 fed from a main control 502 on its output 506 in response to a switching signal 512 inputted on its control input 512 coming from the main control 502. The switching circuit 504 has the function of notifying the integrator and comparator 22 of the switching control of the main control 502 to select the length of integral time to be processed in the integrator and comparator 22. The integrator and comparator 22 has its output 514 interconnected to an absolute value circuit 516.

The absolute value circuit 516, like the absolute value circuit 42, is adapted for detecting or determining the absolute value of the output of the integrator and comparator 22. The absolute value detection makes it possible to stably obtain absolute values, regardless of the conditions of the PPM-modulated phase components. The absolute value circuit 516 has its output 518 interconnected to a switching circuit 520. The switching circuit 520 is a selector for outputting the output 518 of the absolute value circuit 516 to either of its outputs 524 and 526 in response to a switching signal 522 fed from the main control 502. The switching circuit 520 has its one output 524 interconnected to the moving average circuit 56 and its other output 526 to the moving average circuit 58.

The moving average circuits 56 and 58 are processing circuits for moving-averaging absolute value outputs 518 fed through the switching circuit 520 to respectively output the calculated moving-averaged values to the main control 502 connected to the outputs 62 and 64 thereof, respectively. The moving average circuits 54, 56 and 58 are thus adapted to moving-average the absolute values calculated through the integration for a plurality of lengths of integral times, thereby making it possible to avoid the length of integral time to be determined from being unstably varied due to the influence of noise and the like.

The main control 502, like the main control 10 shown in FIG. 1, has the function of generating integral interval control signals 32, 34 and 36 on the basis of moving-averaged values D1, D2 AND D3 supplied from the moving average circuits 54, 56 and 58, respectively, to control the lengths of integral times in the integrator and comparators 20 and 22. The main control 502 in the embodiment generates the switching signal 512 for selecting either of the integral interval control signals 34 and 36 to then output it to the switching circuit 504. The main control 502, when selecting the integral interval control signal 34, outputs to the switching circuit 520 a switching signal 522 for selecting the moving average circuit 56, whereas, when selecting the integral interval control signal 36, the control 502 feeds the switching circuit 520 with the switching signal 522 for selecting the moving average circuit 58. With that configuration, the integrator and comparator 22 can be used on a time-sharing basis to perform integration and comparison for the different lengths of integral times.

In the embodiment, the main control 502 executes determination according to the following expressions (6) and (7):

$$D1 < \alpha 1 \times D2 \quad (6)$$

$$D2 > \alpha 2 \times D3 \quad (7)$$

The main control 502 executes determination of the expressions (6) and (7), when the value of the output (D1) 60 of the moving average circuit 54 has been updated and when the value of the output (D3) 64 of the moving average circuit 58 has been updated, thereby making it possible to decrease the number of comparison cycles and reducing the power consumption. In this way, the integrators are used on a time-sharing basis by periodically replacing the plurality of the lengths of integral times with each other to be fed to the respective integrators in the integrator and comparator 22.

Well, a further alternative embodiment of the PPM demodulation determining circuit will be described with reference to FIG. 6. As shown in the figure, a PPM demodulation determining circuit 600 may be the same as the embodiment shown in FIG. 5 except that the circuit 600 is adapted to selectively connect either of the output 26 of the integrator and comparator 20 and the output 514 of the integrator and comparator 22 to a switching circuit 610, which has its output 612 connected to an analog-to-digital (A/D) converter 614, which has its output 616 connected to a main control 620. The remaining components may be similar to the corresponding components denoted with one and the same reference numerals shown in FIG. 5.

Figure 5:
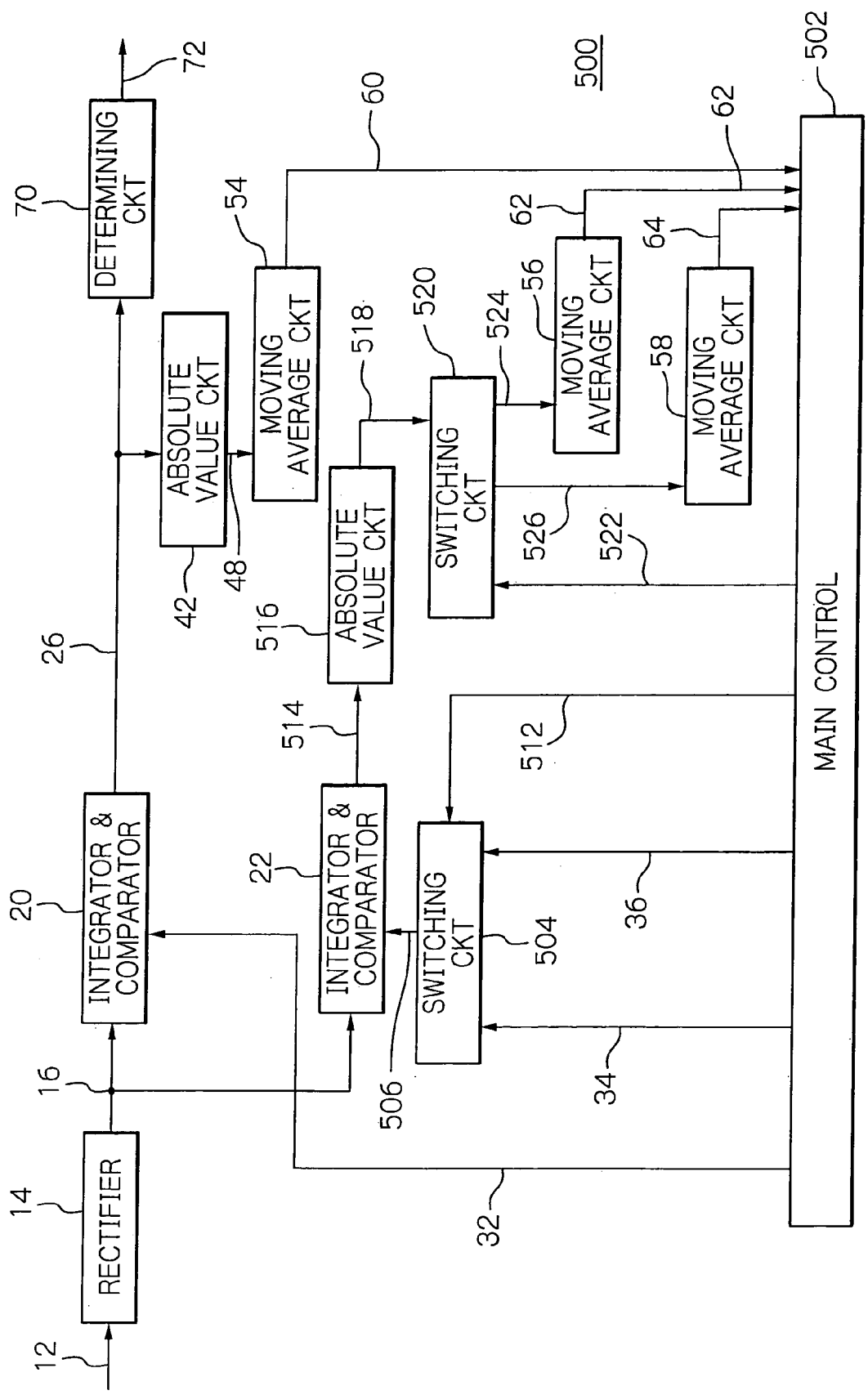
FIG. 5 is a schematic block diagram showing an alternative embodiment of a PPM demodulation determining circuit in accordance with the present invention.
Figure 6:
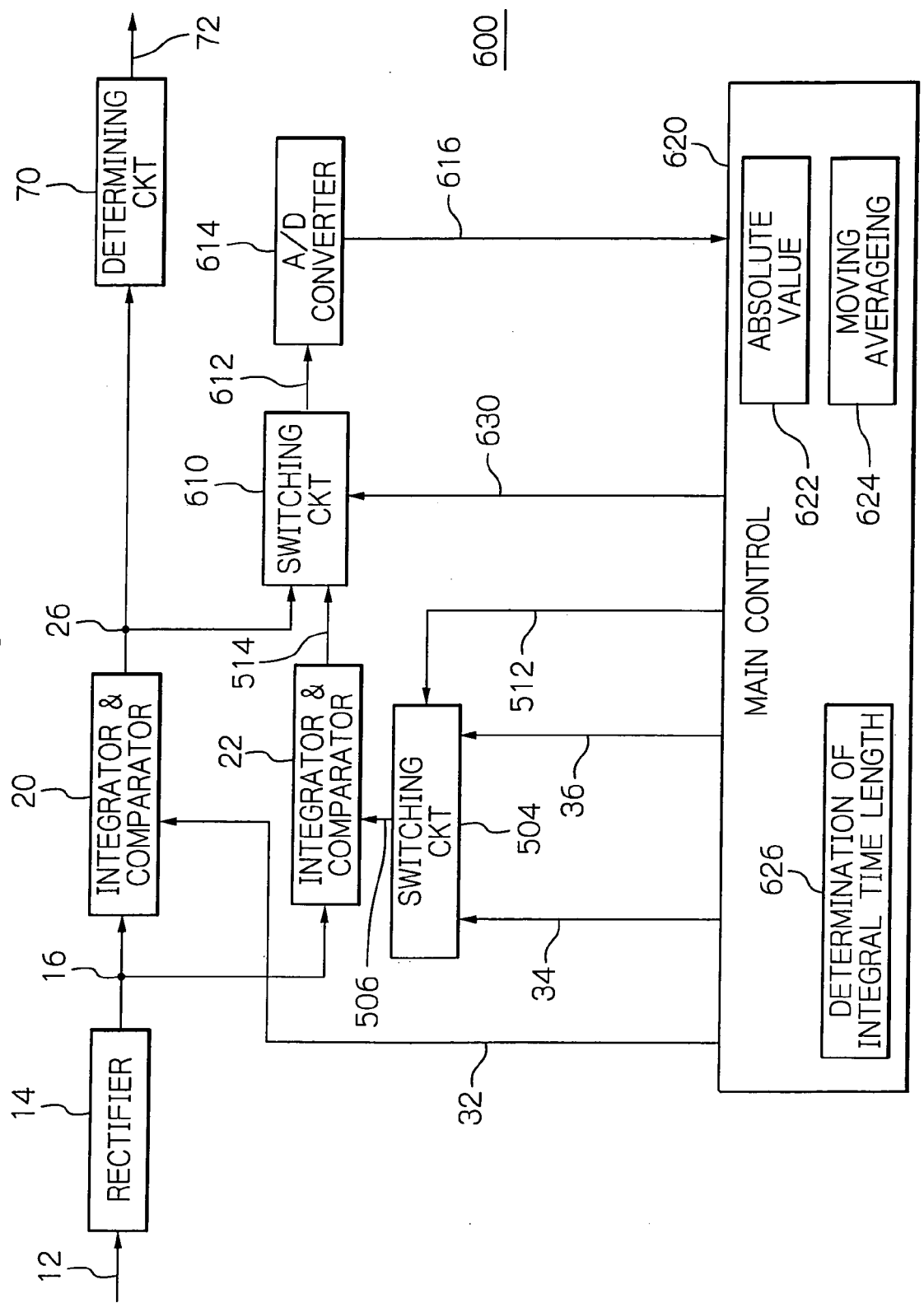
FIG. 6 is also a schematic block diagram showing another alternative embodiment of a PPM demodulation determining circuit in accordance with the invention.

The main control 620 is, like the main control 520 shown in FIG. 5, adapted to generate the integral interval control signals 32, 34 and 36 to output them, and also generate the switching signal to be fed to the switching circuit 504. The main control 620 in the embodiment, in response to the switching signal 630, generates a switching signal to be fed to the switching circuit 610 on its output 630. The switching circuit 610 periodically replaces the comparison result appearing on the input 26 or 514 so as to select and output it on its output 612. The A/D converter 614 converts it to a corresponding digital value to supply the converted digital signal to the main control 620.

The main control 620 has the digital operation functions 622 and 624 of obtaining absolute values and moving-averaging the absolute values for the respective lengths of integral times, respectively, in response to digital signals inputted on its input 616. The main control 620 also has the function 626 of, like with the embodiment shown in FIG. 5, determination of the afore-mentioned expressions (6) and (7) on the basis of the thus obtained moving-averaged values to then determine the lengths of integral times fed to the integrator and comparators 20 and 22. The main control 620 reflects the respective determined lengths of integral times on the integral interval control signals 32, 34 and 36 to output them. Thereby, the length of integral time in PPM demodulation is automatically selected.

As has been described above, in the PPM demodulation determining circuit in those embodiments described above, the lengths of integral times corresponding to the integrated and compared results are automatically selected from a plurality of the different lengths of integral times.

The entire disclosure of Japanese patent application No. 2004-61515 filed on Mar. 5, 2004, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A PPM (pulse position modulated) signal demodulator for receiving and demodulating a PPM signal transmitted in an ultra wide band radio communication system using an ultra wide band, comprising:
   a rectifier for receiving and rectifying the PPM signal to obtain an absolute value signal;
   first, second and third integrating comparators for integrating the absolute value signals for first, second and third integral times, respectively, and comparing integrated values resultant from integration for respective lengths of integral times;
   a determining circuit connected to an output of said second integrating comparator for determining the PPM signal on a basis of an integrated and compared result by said second integrating comparator to output demodulated data; and
   a control circuit for generating first, second and third integral interval control signals for controlling the first, second and third integral times, respectively, on a basis of respective integrated and compared results in said first, second and third integrating comparators,
   whereby said first, second and third integrating comparators integrate the absolute value signals for the respective lengths of the first, second and third integral times associated with the first, second and third integral interval control signals.

2. The PPM signal demodulator in accordance with claim 1, wherein each of said first, second and third integrating comparators comprises:
- a first integrator for integrating the absolute value signal at the first integral interval to generate a first integrated value;
- a second integrator for integrating the absolute value signal at the second integral interval to generate a second integrated value; and
- a comparator circuit for comparing the first integrated value with the second integrated value to output the integrated and compared result.

3. The PPM signal demodulator in accordance with claim 1, wherein said control circuit sets the lengths of the first, second and third integral times to satisfy a value of n-th power of two.

4. The PPM signal demodulator in accordance with claim 1, further comprising first, second and third absolute value converters for respectively converting the integrated and compared results of said first, second and third integrating comparators to corresponding absolute values to output them, said control circuit receiving outputs of said first, second and third absolute value converters as the respective integrated and compared results of said first, second and third integrating comparators.

5. The PPM signal demodulator in accordance with claim 4, further comprising first, second and third averaging circuits connected to the outputs of said first, second and third absolute value converters, respectively, for averaging the absolute values respectively outputted from said first, second and third absolute value converters, said control circuit receiving outputs of said first, second and third averaging circuits as the respective integrated and compared results of said first, second and third integrating comparators.

6. The PPM signal demodulator in accordance with claim 1, wherein said control circuit varies the length of integral time on a basis of a first operation result obtained by multiplying the integrated and compared result according to the length of the first integral time by a first coefficient and a second operation result obtained by multiplying the integrated and compared result according to the length of the second integral time, shorter than the length of the first integral time, by a second coefficient.

* * * * *